United States Patent [19]

Itoh et al.

[11] 4,188,244
[45] Feb. 12, 1980

[54] METHOD OF MAKING A SEMICONDUCTOR LIGHT-EMITTING DEVICE UTILIZING LOW-TEMPERATURE VAPOR-PHASE DEPOSITION

[75] Inventors: Kunio Itoh; Morio Inoue, both of Takatsuki, Japan

[73] Assignee: Matsushita Electric Industrial Co., Ltd., Kadoma, Japan

[21] Appl. No.: 947,419

[22] Filed: Oct. 2, 1978

Related U.S. Application Data

[63] Continuation of Ser. No. 674,723, Apr. 6, 1976, abandoned.

[30] Foreign Application Priority Data

Apr. 10, 1975 [JP] Japan .................................. 50-43967

[51] Int. Cl.² .................. H01L 21/203; H01L 21/94
[52] U.S. Cl. ................................. 148/174; 29/569 L; 29/578; 29/580; 148/1.5; 148/171; 148/173; 331/94.5 H; 357/16; 357/17; 357/18; 357/56; 357/59; 427/87
[58] Field of Search .................... 148/15, 171–173, 148/174; 357/16–18, 56, 59; 331/94.5 H; 29/569 L, 578, 580; 427/86, 87

[56] References Cited

U.S. PATENT DOCUMENTS

| | | | |
|---|---|---|---|
| 3,849,790 | 11/1974 | Gottsmann et al. | 357/18 |
| 3,901,738 | 8/1975 | Hunsberger et al. | 331/94.5 H |
| 4,048,627 | 9/1977 | Ettenberg et al. | 357/17 |
| 4,077,817 | 3/1978 | Bellavance | 148/171 |
| 4,121,177 | 10/1978 | Tsukada | 331/94.5 H |
| 4,121,179 | 10/1978 | Chinone et al. | 357/18 |

OTHER PUBLICATIONS

Light et al., "An Integration Approach for Gr" IBM Tech. Discl. Bull., vol. 9, No. 10, Mar. 1967, pp. 1446–1447.

Tsukada, T., "GaAs-GaAlAs Buried-Heterostructure Injection Lasers" J. Applied Physics, vol. 45, No. 11, Nov. 1974, pp. 4899–4906.

*Primary Examiner*—L. Dewayne Rutledge
*Assistant Examiner*—W. G. Saba
*Attorney, Agent, or Firm*—Cushman, Darby & Cushman

[57] ABSTRACT

In order to decrease threshold current of a semiconductor laser, and to obtain a single mode lasing suitable for use in light-communication, the semiconductor laser is formed in stripe type in which the light-emitting (i.e., active) layer and neighboring layers are formed in mesa-etched stripe type and low impurity-concentration (i.e., high resistivity) layers of GaAs, GaAsP or GaAlAs are situated to contact the mesa-etched side faces of the stripe-shaped part on the semiconductor device by vapor phase growth, vacuum deposition, sputtering, or molecular beam deposition. Since the wafer temperature can be kept fairly low (e.g. 400°–700° C.) in comparison with that (about 950° C.) in a liquid phase growth, the stress introduced during the deposition is smaller than that in a liquid phase growth.

6 Claims, 7 Drawing Figures

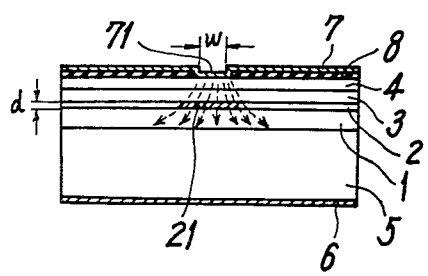
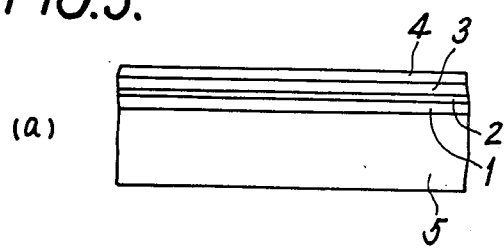
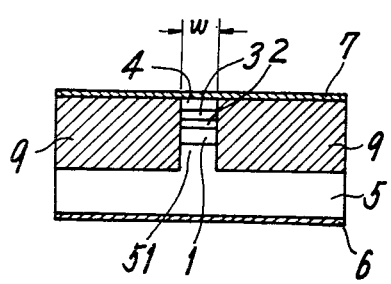
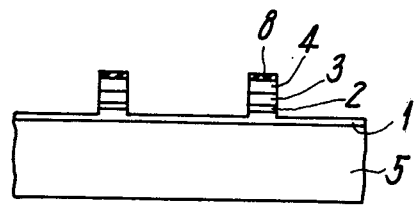
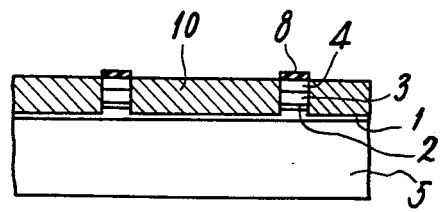
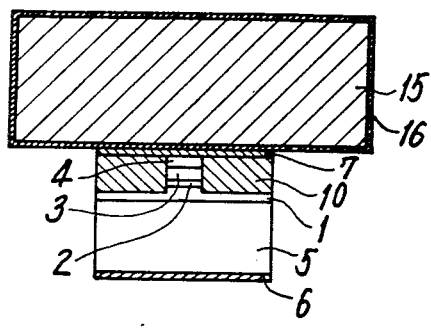

METHOD OF MAKING A SEMICONDUCTOR LIGHT-EMITTING DEVICE UTILIZING LOW-TEMPERATURE VAPOR-PHASE DEPOSITION

This is a continuation, of application Ser. No. 674,723 filed Apr. 6, 1976, now abandoned.

BACKGROUND OF THE INVENTION

This invention relates to semiconductor light-emitting devices, and more particularly, concerns semiconductor lasers of stripe type.

Hitherto, various kinds of stripe type lasers have been proposed. The stripe type laser has merits not only of decreasing its threshold current, but also of achieving simple lasing mode, resulting in easy use in light-communication.

FIG. 1 shows an example of conventional oxide stripe type laser which is a typical example of the stripe type laser. In FIG. 1, reference numerals designate as follows:

5—n-GaAs (substrate)
1—n-$Ga_{0.7}Al_{0.3}As$
2—p-GaAs (active layer)
3—p-$Ga_{0.7}Al_{0.3}As$
4—p-GaAs
8—$SiO_2$ insulation film
6—cathode electrode (Au-Ge alloy film)
7—anode electrode (Au-Sn alloy film)
71—stripe part (contacting part) of the electrode 7 having width "w". The conventional stripe type laser of FIG. 1 has the following shortcomings: The current flowing from the contacting part 71 of the electrode 7 into the semiconductor wafer disperses as shown by the dotted arrows in FIG. 1, and therefore, in the p-GaAs active region 2, the current disperses in the wide area 21 indicated by hatching. Therefore, even though the width of the stripe part 71 of the electrode 7 is limited narrow, width of the effective active region becomes wide, hence making the threshold current large. In such conventional device, also it has been found that the minimum threshold current is obtained when the width w of the contacting part 71 is about $10\mu$, and for the w smaller than $10\mu$ the threshold current increases instead. The section of actual lasing region (hatched part 21 of the active layer 1 in FIG. 1) of the conventional device as seen in the elevation view (FIG. 1) was of oval shape with the major axis of about $10\mu$ and the minor axis of about $0.5\mu$, and accordingly, it was necessary to use cylindrical lens in order to lead the light from the active layer 2 into light-conduit glassfiber (not shown).

In order to eliminate the abovementioned shortcomings, another buried stripe-type heterostructure semiconductor laser shown in FIG. 2 has been proposed.

In FIG. 2, reference numerals designate as follows:
5—n-GaAs substrate
1—n-$Ga_{0.7}Al_{0.3}As$
2—p-GaAs (active layer)
3—p-$Ga_{0.7}Al_{0.3}As$
4—p-GaAs
6—cathode electrode (Au-Ge alloy film)
7—anode electrode (Au-Sn alloy film)
9,9—$Ga_{0.7}Al_{0.3}As$ (of very low impurity concentration).

As shown in FIG. 2, a certain depth from the surface of the substrate 5, the n-$Ga_{0.7}Al_{0.3}As$ layer 1, the p-GaAs active layer 2, p-$Ga_{0.7}Al_{0.3}As$ layer 3 and the p-GaAs layer 4 are mesaetched away at its both side parts so as to retain central stripe part, and the low-impurity concentration $Ga_{0.7}Al_{0.3}As$ layers 9,9 are formed by liquid phase epitaxial growth in place of etched-away parts. In the conventional device of FIG. 2, the width of the actual active region can be limited to the width w of the stripe part, and hence can be controlled to be equal to the thickness (which is about $1\mu$) of the active layer 2. Therefore, the section of actual lasing region can be made round, and hence the lased light can be easily led into a light-conduit fiber without use of a cylindrical lens. Therefore, the matching between the active region and the light-conduit fiber has been improved. Moreover, since the width w of the layers 4, 3, 2, 1 and the protruding part 51 of the substrate 5 are clearly limited to a predetermined value, and therefore, no dispersion of injection current takes place, thereby enabling lasing with such low current as 10 mA. However, the device of FIG. 2 is very difficult in the manufacture, since due to spontaneously formed oxidized films, on the mesa-etched side-surfaces of the layers 1 and 3, (the oxidized film being likely formed when the layers contain Al), the low impurity concentration region 9 can not regularly adhere on these etched side-surfaces, and since the components of the GaAs regions 2 and 4 are likely to melt in the regions 9,9 thereby changing the width of the active layer 2 from the predetermined designed width. Furthermore, it is very difficult to obtain flat surface of the wafer by stopping the growth of the layers 9,9 at an appropriate timing in order to make the upper faces of the low impurity concentration layers 9,9 flush with that of the stripe shaped layer 4. Besides, the p-GaAs active layer 2 and the $Ga_{0.7}Al_{0.3}As$ layers 9,9 have difference by about 26% in thermal expansion coefficient from each other, and therefore, during cooling down from 800° C. for forming the layers 9,9 by liquid phase epitaxial growth, to the room temperature, a considerable strain is made on their interface, resulting in adverse effect on the life of the laser device. Furthermore, the $Ga_{0.7}Al_{0.3}As$ layers 9,9 have so low a heat conduction coefficient as 1/10 of that of GaAs layer 2, and hence, the heat produced in the active layer 2 can not escape through the layers 9,9, but is forced to escape upward and downward only.

SUMMARY OF THE INVENTION

The present invention purports to provide improved semiconductor light-emitting devices, wherein the abovementioned shortcomings can be eliminated.

The present invention is characterized in that the high-resistivity layers, in which the stripe-shaped regions are buried, can be formed without giving the wafer a high temperature. The forming of the high-resistivity layers can be made by vapor phase reaction method, vacuum deposition method or molecular beam epitaxial growth method.

By such method, the high resistivity layers can be grown without strain, and the growth can be well controlled. Also it is possible to make the growth layer highly heat-conductive, thereby attaining low threshold value performance and single mode performance of the semiconductor laser.

BRIEF DESCRIPTION OF THE DRAWING

FIG. 1 and FIG. 2 are sectional elevation views of first and second conventional semiconductor lasers, respectively.

FIGS. 3(a) to (d) are sectional elevation views showing steps of manufacturing semiconductor devices embodying the present invention.

FIG. 4 is a sectional elevation view showing an example of the semiconductor device embodying the present invention.

DETAILED DESCRIPTION OF THE INVENTION

Steps of manufacturing a semiconductor device embodying the present invention are elucidated referring to FIGS. 3(a) to (d).

First, as shown in FIG. 3(a), on an n-type GaAs substrate 5, a first layer 1 of n-type $Ga_{0.7}Al_{0.3}As$, a second layer 2 (light-emitting layer) of p-type GaAs, a third layer 3 of p-type $Ga_{0.7}Al_{0.3}As$ and a fourth layer 4 of $p^+$ type GaAs, which is for contacting electrode, are sequentially formed by the known liquid phase epitaxial growth method.

Then $SiO_2$ films 8,8 of about 5000 A thick are formed with a pattern of rows of stripes having $3\mu$ width and $250\mu$ pitch, the stripes being formed in (110) direction of the substrate by means of known photoetching method utilizing an etchant comprising fluoric acid and ammonium fluoride (FIG. 3(b)).

Next, by utilizing mixture of sulfuric acid and hydrogen peroxide solution, the wafer is mesa-etched, so as to etch away the parts, which are not covered by the $SiO_2$ films 8, of the layers 4, 3, 2 and further of the upper part of the layer 1. In the etching, the layers 4, 3 and 2 must be etched, but the layer 1 and the substrate 5 may not necessarily be etched (FIG. 3(c)).

Subsequently, in the etched hollow parts, high resistivity, for instance of $10^4$ $\Omega$ Cm, (i.e., low impurity concentration) polycrystalline semiconductor layers 10,10 are formed by a process wherein the substrate can be kept at fairly low temperature, for instance 550° C. (FIG. 3(d)). For the low temperature process, molecular beam growth method or vacuum deposition method can be used, but in the present example the layers 10,10 are formed by vapor phase growth method utilizing thermal decomposition. Temperature of the wafer in these processes can be kept fairly low, for instance 400°–700° C., in comparison with higher temperature, for instance 950° C., of the liquid phase growth. Namely, the layers 10,10 are formed by thermal decomposition from trimethylgallium and arsine. In this process, on account of low temperature of the wafer, no layer is formed on the $SiO_2$ film 8, and hence the layers 10,10 grow only on the n-$Ga_{0.7}Al_{0.3}As$ layer 1.

In the prior art of FIG. 2, since the liquid phase epitaxial growth method was used for forming the low impurity concentration layer 9, the layer 9 cannot be formed on the layer 1 of n-$Ga_{0.7}Al_{0.3}As$. Therefore, the mesa-etching must be made so as to expose the substrate region 5. However, in the present invention, since the high resistance layer 10 is formed by the vapor phase growth method, and because of low temperature of the etched surface of n-$Ga_{0.7}Al_{0.3}As$ layer 1 during the growth, no oxide layer is formed on the etched surface. Accordingly, the layers 10,10 can be easily and firmly formed on the layer 1 of n-type $Ga_{0.7}Al_{0.3}As$.

The $SiO_2$ films 8,8 are removed by a known method, and subsequently, the bottom face of the substrate 5 is lapped so that the wafer becomes $100\mu$ thick. Then there are formed an Au-Ge alloy film 6 as cathode electrode onto the bottom face of the substrate and an Au-Sn alloy film 7 as anode electrode as well as heat conducting film onto the upper faces of the p-GaAs layer 4 and of GaAs layer 10 by vacuum deposition method. Thus, Au-Sn alloy film 7 extends from on the p-GaAs layer 4 to on the GaAs layer 10. The resultant wafer is then cut into individual units by known dice-cutting in a manner that in widthwise direction of the stripe the wafer is cut at $250\mu$ pitch along cutting lines situated at each center between the neighboring stripes and in lengthwise direction of the stripe, the wafer is cut at $400\mu$ pitch. FIG. 4 shows a semiconductor laser finished by mounting one resultant unit device on a heat sink 15 of type II diamond coated with metal film 16 such as of Au at least on one face thereof.

Since the high resistivity polycrystalline layers 10,10 have such high resistivity as $10^4$ $\Omega$ Cm, there is no fear that the current undesirably flows thereinto. Generally, in the vapor phase growth methods, a controlling of the grown layer can be made very precisely, and therefore, it is easy to make the surfaces of the high resistance layers 10,10 and the $p^+$ type electrode contacting layer 4 flush with each other.

Furthermore, since the wafer temperature does not rise in the vapor phase growth process for forming the layers 10,10 unlike in the liquid phase growth method, there is less possibility of forming adverse strain in the device of the present invention than in the prior art.

Since the GaAs layers 10,10 have a heat conduction coefficient 10 times as high as that of $Ga_{0.7}Al_{0.3}As$ layers 9,9 of the conventional buried type heterostructure semiconductor device of FIG. 2, a considerable part of the heat produced in the active layers 2 of FIG. 3(d) escapes through the GaAs layers 10,10 thus resulting in good heat dissipation.

As has been illustrated in the foregoing example, the semiconductor laser of the present invention can overcome shortcomings of the prior arts. Furthermore, the threshold current can be made smaller and the lasing mode simpler than the prior arts.

The aforementioned example used polycrystalline GaAs as the high resistivity layers 10, 10, but other III-V semiconductor polycrystalline of high resistivity, for instance $Ga_{1-y}Al_yAs$ ($0<y<1$) or $GaAs_{1-y}P_y$ ($0<y<1$) may also be used, though the abovementioned GaAs has better heat dissipation than these semiconductors. Furthermore polycrystalline layer of II–VI compound, such as CdS or CdTe also may be used.

For the low temperature forming process of the high resistivity layers 10, 10, vacuum deposition method, sputtering method or molecular beam deposition method instead of the vapor phase growth method, can be used.

According to the manufacturing method of the present invention, a superior semiconductor laser of very low threshold current density can be made.

What we claim is:

1. A method of making a semiconductor light-emitting device comprising the following steps:

epitaxially forming at least a light-emitting active region and an electrode-contacting region on a semiconductor substrate, etching said epitaxially formed regions in a manner that selected parts of said regions are etched away forming one or more recesses, the bottoms of which reach at least a depth of the lower junction of said light-emitting active region, depositing a high resistivity polycrystalline semiconductor at a relatively low temperature in said one or more recesses to form a polycrystalline semiconductor region, wherein said deposition is done by one method selected from the group consisting of vapor phase reaction, vacuum deposition, sputtering and molecular beam growth, and forming a metal electrode layer onto the surface of said electrode contacting region, extending onto the surface of said high resistivity polycrystalline semiconductor region.

2. A method of making a semiconductor light-emitting device of claim 1, wherein said vapor phase reaction is made by thermal decompositions of trimethyl gallium $Ga(CH_3)_3$ and arsine ($AsH_3$).

3. A method of making a semiconductor light-emitting device of claim 1, wherein said epitaxial forming is done by a liquid phase epitaxial growth.

4. A method of making a semiconductor light-emitting device of claim 1, wherein said etching is stopped at a depth midway of a region which is immediately under the light-emitting active region.

5. A method of making a double heterostructure semiconductor laser, comprising the following steps:

forming by liquid phase epitaxial growth on a semiconductor substrate of a III-V compound crystal of a first conductivity type, a first semiconductor region of a III-V compound mixed crystal of said first conductivity type, forming thereon by liquid phase epitaxial growth a second region of III-V compound crystal, to form a light-emitting active region, forming thereon by liquid phase epitaxial growth a third region of III-V compound mixed crystal of a second conductivity type, which is opposite to said first conductivity type, forming thereon by liquid phase epitaxial growth method a fourth region of III-V compound crystal of said second conductivity type, etching specified parts of the resultant wafer from the surface of the fourth region to a depth of midway of said first region, thereby to form at least one recess, and forming a high resistivity polycrystalline semiconductor region by vapor phase reaction at a relatively low temperature to fill said recess.

6. A method of making a semiconductor light-emitting device of claim 5, wherein said III-V compound crystal is of GaAs and said III-V compound mixed crystal is of GaAlAs.

* * * * *